(12) United States Patent
Yamada et al.

(10) Patent No.: US 8,049,525 B2
(45) Date of Patent: Nov. 1, 2011

(54) PARALLELISM ADJUSTING MECHANISM OF PROBE CARD

(75) Inventors: Yoshio Yamada, Nagano (JP); Hiroshi Nakayama, Nagano (JP); Mitsuhiro Nagaya, Nagano (JP); Tsuyoshi Inuma, Nagano (JP); Takashi Akao, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 192 days.

(21) Appl. No.: 12/309,825

(22) PCT Filed: Jul. 26, 2007

(86) PCT No.: PCT/JP2007/064703
§ 371 (c)(1),
(2), (4) Date: Jul. 7, 2009

(87) PCT Pub. No.: WO2008/015962
PCT Pub. Date: Feb. 7, 2008

(65) Prior Publication Data
US 2010/0001752 A1    Jan. 7, 2010

(30) Foreign Application Priority Data
Jul. 31, 2006    (JP) .................................. 2006-208911

(51) Int. Cl.
*G01R 31/20* (2006.01)
(52) U.S. Cl. ................................................. 324/754.11
(58) Field of Classification Search ............ 324/754.01–754.14, 762.01–762.1, 324/755.01–755.11, 756.03–756.05
See application file for complete search history.

(56) References Cited

U.S. PATENT DOCUMENTS

| 7,075,319 B2 | 7/2006 | Mori |
| 7,307,435 B2* | 12/2007 | Mori ..................... 324/756.03 |
| 2004/0104738 A1 | 6/2004 | Mori |

(Continued)

FOREIGN PATENT DOCUMENTS

JP    2001-524258    11/2001

(Continued)

OTHER PUBLICATIONS

International Search Report mailed Oct. 23, 2007, issued on PCT/JP2007/064703.

(Continued)

*Primary Examiner* — Huy Q Phan
*Assistant Examiner* — Tung X Nguyen
(74) *Attorney, Agent, or Firm* — Edwards Angell Palmer & Dodge LLP

(57) ABSTRACT

A parallelism adjusting mechanism of a probe card is provided. The parallelism adjusting mechanism can bring probes held by a probe card into uniform contact with a wafer even if a parallelism between a mounting reference surface for the probe card and the wafer as a test object is lost. To achieve this purpose, specifically, to adjust a parallelism of a probe card (101) that holds a plurality of probes (1) for electrically connecting a wafer (31) as a test object and a circuitry for generating a signal for a test with respect to the wafer (31), adjusting screws (22) as at least part of an inclination changing unit are provided. The inclination changing unit changes a degree of inclination of the probe card (101) with respect to a mounting reference surface ($S_1$) of a prober (202) for mounting the probe card (101) thereon.

11 Claims, 9 Drawing Sheets

U.S. PATENT DOCUMENTS

| | | |
|---|---|---|
| 2006/0061375 A1 | 3/2006 | Mori |
| 2008/0048698 A1 | 2/2008 | Amemiya et al. |

FOREIGN PATENT DOCUMENTS

| | | |
|---|---|---|
| JP | 2002-323538 | 11/2002 |
| JP | 2003-324132 | 11/2003 |
| JP | 2006-010629 | 1/2006 |
| JP | 2006-118932 | 5/2006 |
| TW | 200402535 | 10/2004 |
| TW | 200606435 | 2/2006 |
| WO | WO-96/38858 | 12/1996 |
| WO | WO-2006/001476 A1 | 1/2006 |

OTHER PUBLICATIONS

Taiwanese Office Action 096127945 dated Jan. 24, 2011.

* cited by examiner

PARALLELISM ADJUSTING MECHANISM OF PROBE CARD

TECHNICAL FIELD

The present invention relates to a parallelism adjusting mechanism of a probe card that adjusts a parallelism of the probe card for electrically connecting a wafer as a test object and a circuitry for generating a signal for a test.

BACKGROUND ART

In a semiconductor manufacturing process, an electric characteristic test such as a conductivity test is performed to detect a defective product by bringing probes having conductivity (conductive probes) into contact with a wafer before dicing (WLT: Wafer Level Test). When this WLT is performed, to transfer a signal for a test to the wafer, a probe card including a large number of probes is used. In the WLT, the probes are individually brought into contact with each of dies on the wafer while the dies are scanned by the probe card. However, because several hundreds to several ten thousands dies are formed on the wafer, it takes considerable time to test one wafer. Thus, an increase in the number of dies causes higher cost.

To solve the problems of the WLT, recently, a method called FWLT (Full Wafer Level Test) is also used in which several hundreds to several ten thousands probes are collectively brought into contact with all or at least a quarter to a half of dies on a wafer (for example, see Patent document 1). To accurately bring the probes into contact with electrode pads on the wafer, this method requires technologies for maintaining positional accuracy of tips of probes by accurately keeping the parallelism or the flatness of a probe card with respect to a surface of the wafer and for highly accurately aligning a wafer.

Patent document 1: Japanese translation No. 2001-524258 of PCT international application

DISCLOSURE OF INVENTION

Problem to be Solved by the Invention

In the conventional probe card, however, when the parallelism between a mounting reference surface for the probe card and the wafer is lost, there arises a problem that probes held by the probe card cannot be brought into uniform contact with the wafer.

The present invention has been achieved to solve the above problems in the conventional technology and it is an object of the present invention to provide a parallelism adjusting mechanism of a probe card capable of bringing probes held by a probe card into uniform contact with a wafer even if the parallelism between the mounting reference surface for the probe card and the wafer as a test object is lost.

Means for Solving Problem

A parallelism adjusting mechanism of a probe card according to an aspect of the present invention includes a probe card for holding a plurality of probes electrically connecting a wafer as a test object and a circuitry for generating a test signal; a prober for mounting thereon the probe card; and an inclination changing unit that changes a degree of inclination of the probe card with respect to a mounting reference surface for the probe card to be mounted on the prober to adjust a parallelism of the probe card with respect to the wafer.

In the above invention, the prober may include a frame member having a lower surface as the mounting reference surface; and a docking member that is interposed between the frame member and the probe card, is fastened to the frame member, and has a first surface in close contact with a surface of the probe card, and the inclination changing unit may move the docking member with respect to the frame member.

In the above invention, the inclination changing unit may include at least three adjusting screws which are arranged on a circumference of a circle on the mounting reference surface, and are fixed to the frame member so as to be movable in a direction perpendicular to the mounting reference surface, and of which tips can come into contact with a second surface of the docking member.

In the above invention, recesses for centering may be formed in the docking member at positions with which the tips of the adjusting screws come into contact.

In the above invention, the prober may include a frame member having a lower surface as the mounting reference surface; and a docking member that is interposed between the frame member and the probe card, is fastened to the probe card, and has a surface in close contact with the lower surface of the frame member, and the inclination changing unit moves the docking member with respect to the frame member.

In the above invention, the inclination changing unit may include at least three adjusting screws which are arranged on a circumference of a circle on the mounting reference surface, and are fixed to the docking member so as to be movable in a direction perpendicular to the mounting reference surface, and of which tips can come into contact with a surface of the probe card.

In the above invention, recesses for centering may be formed at positions of the probe card with which the tips of the adjusting screws come into contact.

In the above invention, the prober may include a probe card holder on which a part of a surface of the probe card on a side of the probes that protrude is mounted, the mounting surface being the mounting reference surface, and the inclination changing unit may move the probe card with respect to the probe card holder.

In the above invention, the probe card may include a wiring substrate that includes wires electrically connecting the probes and the circuitry; and a reinforcing member that is mounted on the wiring substrate to reinforce the wiring substrate, and the inclination changing unit includes at least three adjusting screws which are arranged on a circumference of a circle on the mounting reference surface, and are fixed from a bottom of the probe card holder so as to be movable in a direction perpendicular to the mounting reference surface, and of which tips can come into contact with a bottom of the reinforcing member.

In the above invention, the inclination changing unit may include at least three adjusting screws which are arranged on the circumference of the circle on the mounting reference surface, are fixed from a top surface of the probe card so as to be movable in the direction perpendicular to the mounting reference surface, and can come into contact with the mounting surface of the probe card holder, and recesses for centering may be formed at positions on the mounting surface with which tips of the adjusting screws come into contact.

In the above invention, the probe card may include a wiring substrate that includes wires electrically connecting the probes and the circuitry; and a reinforcing member that is mounted on the wiring substrate to reinforce the wiring substrate, and the inclination changing unit may include at least three fastening screws which are arranged on the circumference of the circle on the mounting reference surface, and are fixed from a top surface of the reinforcing member so as to be movable in the direction perpendicular to the mounting reference surface; and a plurality of post members that penetrate the wiring substrate in its thickness direction and are buried therein, have a height larger than the thickness of the wiring substrate, and can screw the fastening screws thereinto, respectively, the plurality of post members including post members having different heights.

Effect of the Invention

The parallelism adjusting mechanism of the probe card according to the present invention includes the inclination changing unit that changes a degree of inclination of the probe card with respect to the mounting reference surface of the prober on which the probe card is mounted, to adjust a parallelism of the probe card that holds a plurality of probes for electrically connecting the wafer as a test object and the circuitry for generating a signal for a test. Thus, even if the parallelism between the mounting reference surface for the probe card and the wafer as the test object is lost, the probes held by the probe card can be brought into uniform contact with the wafer.

Figure 1:
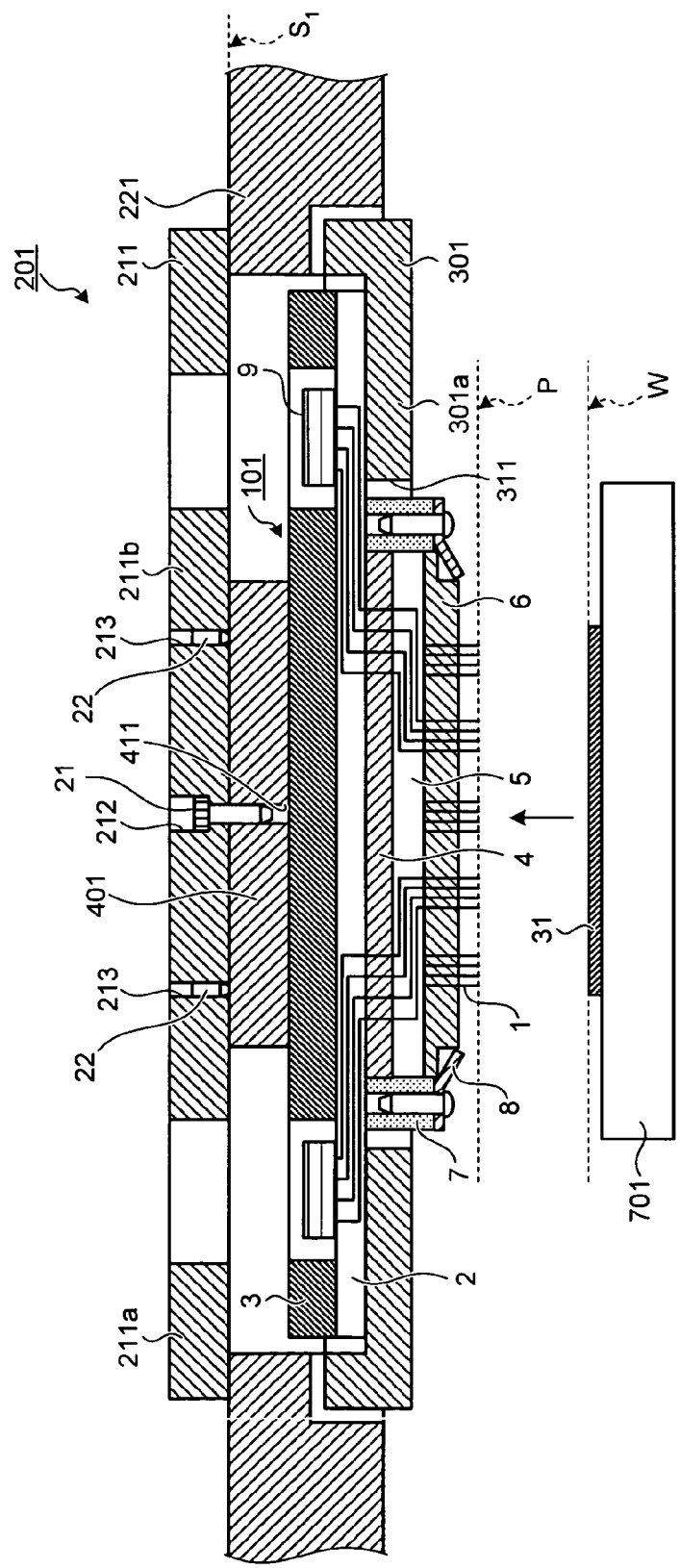
FIG. 1 is a diagram of the structure of a parallelism adjusting mechanism of a probe card according to a first embodiment of the present invention.

EXPLANATIONS OF LETTERS OR NUMERALS 1 probe
2, 12, 14, 16 wiring substrate
3, 11, 13, 15, 17 reinforcing member
4 interposer
5 space transformer
6 probe head
7 holding member
8 leaf spring
9 male connector
21, 23, 27 fastening screw
22, 24, 25, 26 adjusting screw
31 wafer
51 connection terminal
61, 62 post member
101, 102, 103, 104, 105 probe card
111, 121, 141, 151, 161, 171, 212, 213, 232, 322, 411, 421, 422 hole portion
201, 202, 203, 204, 205 prober
211, 231 frame member
211a, 231a outer peripheral portion
211b, 231b central portion
211c coupling portion
221 support member
301, 302, 303, 304 probe card holder
301a, 302a, 303a, 304a main plate portion
311, 321, 331, 341 hollow portion
332 recess
401, 402 docking member
501 terminal seat
611, 621 concave portion
701 wafer chuck
$S_1$, $S_2$ mounting reference surface

BEST MODE(S) FOR CARRYING OUT THE INVENTION

Best modes for carrying out the present invention (hereinafter, "embodiments") are explained below with reference to the accompanying drawings. It should be noted that the drawings are schematic and a relation between the thickness and width of each portion, a ratio of the thicknesses of the respective portions and the like are different from realistic ones. It goes without saying that the drawings depict some portions as having different relations and ratios of dimensions.

First Embodiment

FIG. 1 is a cross section of the structure of a parallelism adjusting mechanism of a probe card according to a first embodiment of the present invention. FIG. 1 shows a probe card 101 that houses a plurality of probes 1 made of a conductive material, and also shows the relevant part of a prober 201 on which the probe card 101 is mounted and that performs an electric characteristic test for a wafer 31 as a test object.

First, the structure of the probe card 101 will be explained. The probe card 101 electrically connects the wafer 31 as a test object and a circuitry that generates a signal for a test, using the probes 1, and includes a disk-shaped wiring substrate 2 with wires formed thereon, a reinforcing member 3 that is mounted on one side of the wiring substrate 2 and reinforces the wiring substrate 2, an interposer 4 for connection of the wires led out from the wiring substrate 2, a space transformer 5 that transforms an interval of the wires connected through the interposer 4, and a probe head 6 that is formed in a disk shape having a diameter smaller than that of the wiring substrate 2 and stacked on the space transformer 5 to house and hold the probes 1 according to a wiring pattern of the wafer 31. The probe card 101 also includes a holding member 7 that is fixed to the wiring substrate 2 and collectively holds the interposer 4 and the space transformer 5 in a stacked state, a leaf spring 8 that is fixed to the holding member 7 and fixes an end of the probe head 6, and a male connector 9 that electrically connects the wiring substrate 2 and the circuitry for the test.

The wiring substrate 2 is formed by using an insulating material such as Bakelite or epoxy resin. In the wiring substrate 2, a wiring layer is three-dimensionally formed by via-holes and the like. One ends of the wires formed on the wiring substrate 2 are connected to the male connector 9 and the other ends thereof are connected to the space transformer 5. It is noted that only a part of the wires are schematically shown in FIG. 1 to simplify the description.

The reinforcing member 3 is formed in a disk shape and has a hollow portion capable of exposing the male connector 9 upward. The reinforcing member 3 is realized by a material of high hardness such as alumite-finished aluminum, stainless steel, an invar material, a Kovar material (registered trademark), or duralumin.

The interposer 4 is formed in a thin plate shape. As the interposer 4, for example, any component can be used in which a plurality of through holes are formed in a base material made of, for example, machinable ceramics and extensible connection terminals are passed through the through holes. One ends of the connection terminals are in contact with electrode pads of the space transformer 5 and the other ends thereof are in contact with electrode pads of the wiring substrate 2. The connection terminal in this case may be formed of a coil spring around which a conductive material is wound, or may be formed in such a manner that pin-type conductive connection members are fixed to both ends of a conductive spring. It is noted that as the interposer 4, any component having a thin-film base material made of an insulating material such as polyimide and having a plurality of leaf-spring type connection terminals formed in a cantilever shape disposed on both sides of the base material may be used. Alternatively, pressure conductive rubber, in which metal particles are arranged in a thickness direction in sheeted silicone rubber, may be used as the interposer 4.

In the space transformer 5, a wiring layer in the inside, as in the wiring substrate 2, is three-dimensionally formed by via-holes and the like. The space transformer 5 has a surface substantially congruent with the interposer 4 and is formed in a thin plate shape. Such a space transformer 5 includes an insulating material such as alumina ceramics as a base material and also plays a function of reducing a difference between the coefficient of thermal expansion of the probe head 6 and the coefficient of thermal expansion of the wiring substrate 2.

The probe head 6 is formed in a disk shape made of an insulating material such as ceramics and is formed so that a plurality of through hole portions for housing the probes 1 penetrate the probe head 6 in the thickness direction according to the arrangement of the wafer 31. The number and an arrangement pattern of the probes 1 housed in the probe head 6 are decided according to the number of semiconductor chips formed in the wafer 31 and an arrangement pattern of the electrode pads. For example, when the wafer 31 having a diameter of 8 inches (about 200 millimeters) is a test object, several hundreds to several thousands probes 1 are necessary. When the wafer 31 having a diameter of 12 inches (about 300 millimeters) is a test object, several thousands to several ten thousands probes 1 are necessary.

The probes 1 housed by the probe head 6 are housed and held in the probe head 6 so that the tips on one side of the probes protrude according to the arrangement pattern of the electrode pads of the wafer 31 placed on a wafer chuck 701. The protruding tips of the probes 1 come into contact with surfaces of the electrode pads of the wafer 31 with predetermined pressure from a vertical direction. The probes 1 are formed in a fine needle shape and are extensibly and resiliently biased in its longitudinal direction. Any one of conventionally known probes can be used as the probes 1.

The holding member 7 is formed of the same material as that of the reinforcing member 3, and includes a hollow portion in which the stacked interposer 4 and the space transformer 5 can be held. The holding member 7 is fixed to the wiring substrate 2 using screws (not shown) or the like.

The leaf spring 8 is formed of an elastic material such as phosphor bronze, stainless steel, or beryllium copper, is formed in a thin annular shape, and is fastened to the holding member 7. The leaf spring 8 uniformly presses near a periphery of the surface of the probe head 6 along its entire circumference in a direction of the wiring substrate 2. Therefore, a substantially uniform initial load is generated in the probes 1 housed in the probe head 6 and warp of the probe head 6 can thereby be prevented.

The male connectors 9 are disposed radially with respect to the center of the wiring substrate 2 and form pairs with respective female connectors (not shown) included in the prober 201. Terminals of the male connectors and the female connectors come into contact with each other to thereby establish electrical connection between the probes 1 and the circuitry for the test. As a connector including the male connectors 9 and the female connectors, it is possible to apply a ZIF type connector. If the ZIF type connector is applied, the probe card 101 and the testing device are hardly subjected to stress due to connection even if the number of the probes 1 is large, reliable electrical connection can be obtained, and durability of the probe card 101 can be improved. The arrangement positions of the male connectors 9 are not necessarily limited to the above-mentioned ones. The female connectors may be disposed on the wiring substrate 2.

To assemble the probe card 101 having the structure, when the wiring substrate 2, the reinforcing member 3, the interposer 4, the space transformer 5, the probe head 6, and the holding member 7 are sequentially stacked on each other, it is more preferable that the components are mutually positioned using predetermined positioning pins.

Figure 2:
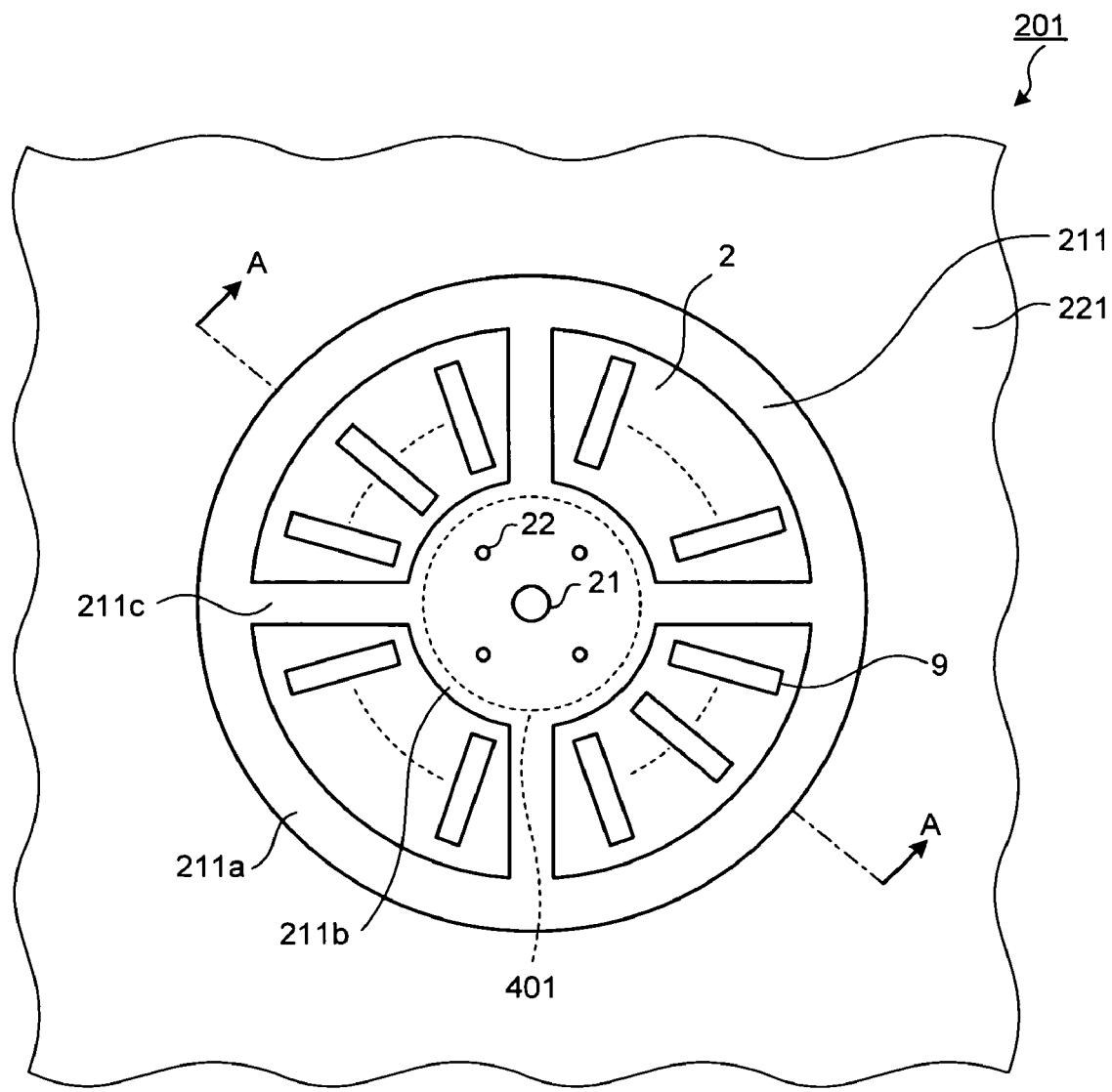
FIG. 2 is a top view of the structure of relevant part of a prober.

Next, the structure of the relevant part of the prober 201 will be explained below. FIG. 2 is a top view of the prober 201. It is noted that FIG. 1 is a cross section taken along line A-A of FIG. 2. The prober 201 includes a frame member 211 for fixing thereto the probe card 101 in the side of the reinforcing member 3, a support member 221 that supports the frame member 211, and a probe card holder 301 that holds the bottom of the probe card 101. The prober 201 is formed of metal such as stainless steel or aluminum, and includes a disk-shaped docking member 401 fastened to the frame member 211 and interposed between the frame member 211 and the reinforcing member 3 of the probe card 101, and also includes the wafer chuck 701 on which the wafer 31 is placed. The prober 201 further includes a drive unit (not shown) that moves the wafer chuck 701 up and down, an aligning unit (not shown) that aligns between the probes 1 and the wafer 31, and a control unit (not shown) that controls operations of the prober 201.

The frame member 211 includes a circular outer peripheral portion 211*a* that has a diameter slightly larger than that of the wiring substrate 2 of the probe card 101, a central portion 211*b* that has the center the same as that of a circle formed by the outer peripheral portion 211*a* and is formed in a dish shape having a surface area slightly larger than an area of the docking member 401, and four coupling portions 211*c* that extend from an outer peripheral direction of the central portion 211*b* to reach the outer peripheral portion 211*a* and couple the outer peripheral portion 211*a* and the central portion 211*b*.

Provided in the central portion 211*b* of the frame member 211 is a hole portion 212 penetrating the center of the central portion 211*b* in the thickness direction. A screw thread (not shown) into which a fastening screw 21 for fastening the frame member 211 and the docking member 401 can be screwed is provided in an internal side face of the hole portion 212. Four hole portions 213 are formed in the central portion 211b of the frame member 211 at centrally symmetric positions on the same circumference of a circle on the mounting reference surface $S_1$. A screw thread (not shown) is provided in each internal side face of the hole portions 213, and an adjusting screw 22 for adjusting a parallelism of the probe card 101 is screwed into the screw thread.

The probe card holder 301 includes a main plate portion 301a formed in a thin disk shape in which a hollow portion 311 for exposing the surface of the probe head 6 is formed in a state of holding the probe card 101 and on which the bottom portion of the wiring substrate 2 can be placed.

Provided in the central portion of the docking member 401 is a hole portion 411 penetrating the central portion in the thickness direction. A screw thread (not shown) into which the fastening screw 21 can be screwed is provided in an internal side face of the hole portion 411. When the docking member 401 and the frame member 211 are to be fastened to each other, the fastening screw 21 is screwed into the hole portion 212 and the hole portion 411 which coaxially communicate with each other, to fasten the both members. The adjusting screw 22 screwed into each of the hole portions 213 of the frame member 211 is buried so that a tip portion thereof comes into contact with the surface of the docking member 401. The adjusting screw 22 is movable upward and downward in a direction perpendicular to the mounting reference surface $S_1$. The bottom of the docking member 401 and the top surface of the reinforcing member 3 of the probe card 101 are in close contact with each other with no space therebetween, and therefore, the probe card 101 moves following the movement of the docking member 401.

The docking member 401 functions as a spacer for adjusting the height of the tips of the probes 1. Specifically, the docking member 401 has a thickness so that the probes 1 come into contact with the wafer 31 and move a stroke and then the tips of the probes 1 reliably protrude downward from the bottom of the probe card holder 301.

Figure 3:
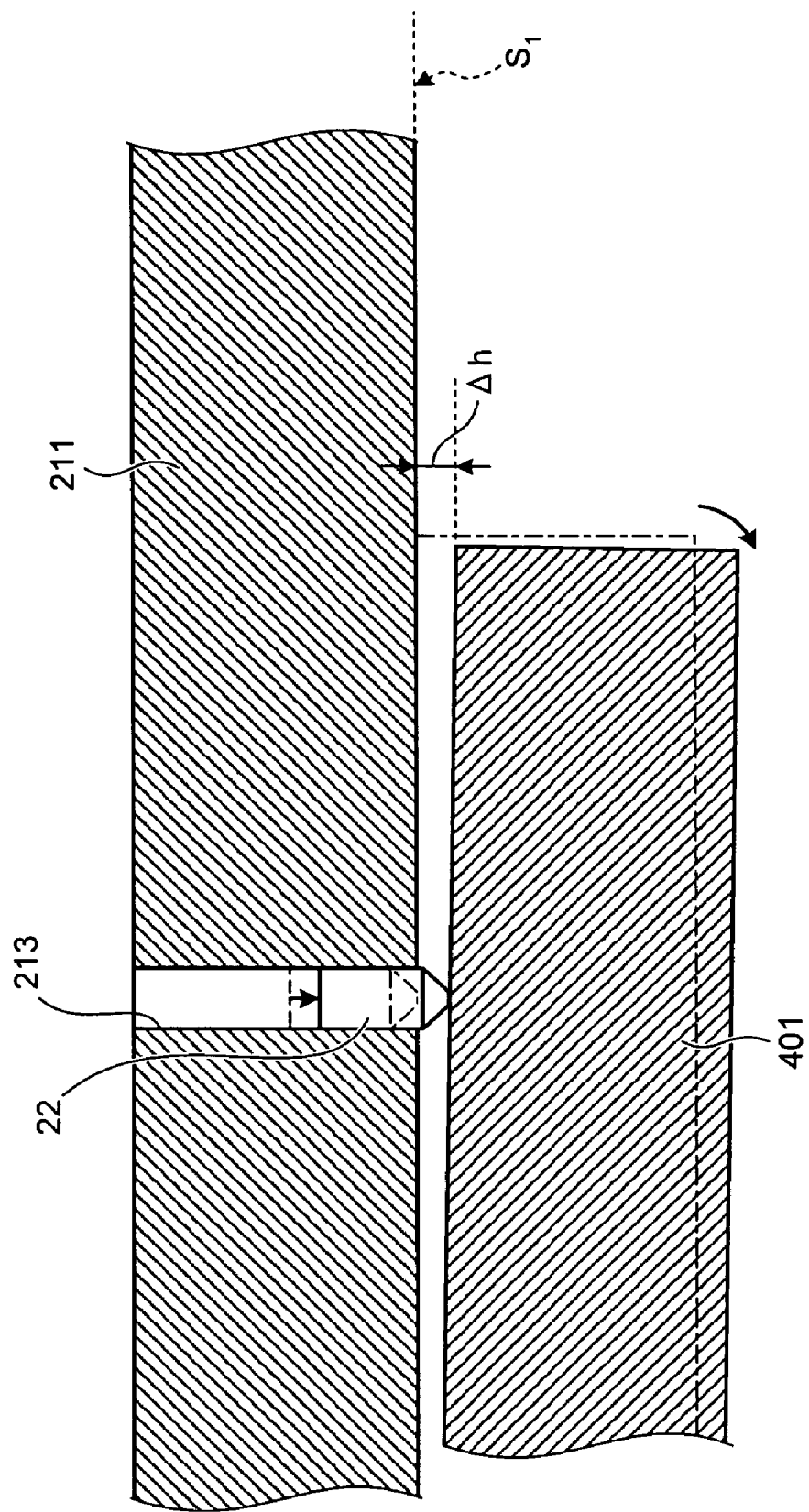
FIG. 3 is a diagram for explaining a function of an adjusting screw used in the first embodiment of the present invention.

Next, the function of the adjusting screw 22 will be explained below with reference to FIG. 3. In the first embodiment, the adjusting screws 22 are turned to move the tip positions of the adjusting screws 22 forward and backward or upward and downward in FIG. 3, so that the docking member 401 is moved with respect to the frame member 211, to change the degree of inclination of the top surfaces of the docking member 401 and the reinforcing member 3 with respect to the mounting reference surface $S_1$ for the probe card 101 which is in close contact with the bottom of the docking member 401. In this sense, the adjusting screws 22 are formed as at least a part of the inclination changing unit. In the case of FIG. 3, by moving the adjusting screws 22 downward in the figure, the parallelism between the mounting reference surface $S_1$ as the bottom of the frame member 211 and the docking member 401 is lost. However, this would be no problem because what should be adjusted here is the parallelism between a plane P passing through the tip positions of the probes 1 and a plane W passing through the surface of the wafer 31 (see FIG. 1). It is noted that a moving amount Δh of the docking member 401 moved by the adjusting screws 22 is only about several tens to several hundreds of micrometers (μm).

FIG. 2 shows the case where the four adjusting screws 22 are fixed allowing for the structure (four coupling portions 211c) of the frame member 211. However, the number of adjusting screws 22 is generally required so as to form one plane by the tips of the adjusting screws 22, and thus, three screws at minimum should simply be provided. Meanwhile, if too many adjusting screws 22 are provided, it becomes difficult to adjust the parallelism by changing the degree of inclination. Therefore, about three to six adjusting screws 22 are more preferable to be fixed to the frame member 211. Besides, the arrangement positions of the adjusting screws 22 are not limited to the case explained above, and thus, they are simply determined as required depending on conditions of thicknesses, surface areas, and rigidities of the wiring substrate 2, the reinforcing member 3, the interposer 4, and the space transformer 5, or the like.

When the degree of inclination of the docking member 401 with respect to the frame member 211 is to be changed to adjust the parallelism of the probe card 101, by taking an image near the tips of the probes 1 with an imaging unit such as a camera and adjusting how the adjusting screws 22 are tightened while referring to the image, so that the degree of inclination can be efficiently changed, which is more preferred.

With the parallelism adjusting mechanism of the probe card according to the first embodiment of the present invention as explained above, the parallelism of the probe card that holds the probes electrically connecting the wafer as the test object and the circuitry for generating a signal for a test with respect to the wafer is adjusted. Therefore, by providing the inclination changing unit that changes the degree of inclination of the probe card with respect to the mounting reference surface of the prober on which the probe card is mounted, even if the parallelism between the mounting reference surface for the probe card and the wafer as the test object is lost, the probes held by the probe card can be brought into uniform contact with the wafer.

According to the first embodiment, by adjusting the probes so as to come in uniform contact with the wafer, it is possible to realize an electric characteristic test for the wafer with high accuracy and high reliability.

Further, according to the first embodiment, because the positional accuracy of the tips of the probes is improved, it is possible to minimize fluctuation of positions of the tips among the probes in their height direction, and allow the strokes of all the probes to be nearly constant, so that stable contact resistance can be obtained. In addition, by making the strokes of all the probes nearly constant, applying excessive load to a particular probe can be eliminated, which prevents excessive damage to the electrode pads on the wafer. It is also possible to prevent degradation of a yield in a bonding process (wire bonding or the like) between dies and a package, and to prevent brakeage or the like of wires connected to the electrode pads.

Second Embodiment

Figure 4:
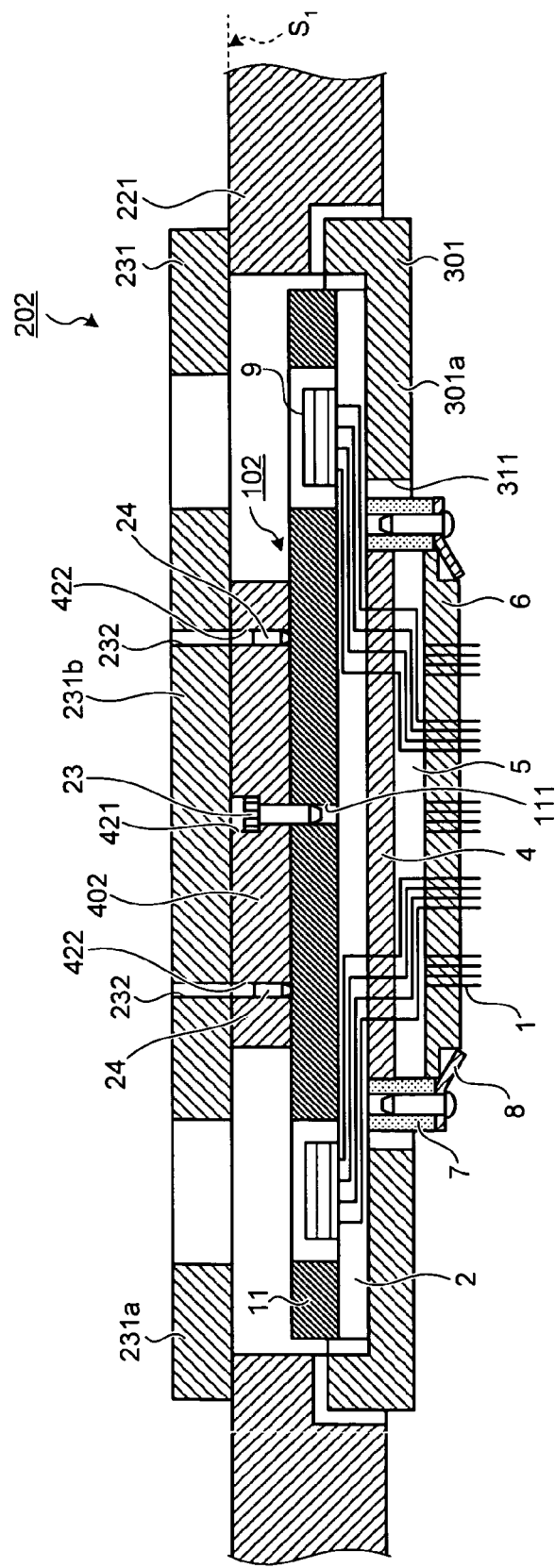
FIG. 4 is a diagram of the structure of a parallelism adjusting mechanism of a probe card according to a second embodiment of the present invention.

FIG. 4 is a diagram of the structure of a parallelism adjusting mechanism of a probe card according to a second embodiment of the present invention. A probe card 102 has a hole portion 111 provided in the central portion of a reinforcing member 11 that reinforces the wiring substrate 2. The structure of the probe card 102 except for the above-explained portion is the same as that of the probe card 101.

A prober 202 that mounts the probe card 102 thereon includes a frame member 231 for fixing the probe card 102 in the side of the reinforcing member 11, and a disk-shaped docking member 402 interposed between the frame member 231 and the probe card 102 and fastened to the probe card 102. A hole portion 421 coaxially communicable with the hole portion 111 upon fixture is formed in the central portion of the docking member 402, and by screwing a fastening screw 23 into these hole portions 111 and 421, the docking member 402 and the reinforcing member 11 are fastened to each other.

A plurality of hole portions 422 are arranged at centrally symmetric positions in the docking member 402. In the second embodiment, the top surface of the docking member 402 is in close contact with a central portion 231b of the frame member 231 with no space therebetween. In this sense, it can be also said that the hole portions 422 are arranged at centrally symmetric positions on the same circumference of a circle on the mounting reference surface $S_1$. Provided in each internal side face of these hole portions 422 is a screw thread (not shown) into which each of adjusting screws 24 can be screwed, the adjusting screws 24 being a part of the inclination changing unit that changes the degree of inclination of the reinforcing member 11 of the probe card 102 with respect to the mounting reference surface $S_1$. The number of the hole portions 422 is preferably about three to six, similarly to the first embodiment.

The tips of the adjusting screws 24 are in contact with the top surface of the reinforcing member 11. In the second embodiment, because the probe card 102 is fastened to the docking member 402, the degree of inclination of the probe card 102 with respect to the docking member 402 is changed to enable adjustment of the parallelism of the probe card 102 before the probe card 102 is mounted on the prober 202.

Provided in the frame member 231 are hole portions 232 each of which coaxially communicates with each of the hole portions 422 of the docking member 402 when the probe card 102 is mounted on the prober 202. Therefore, even after the probe card 102 is mounted on the prober 202, the tip positions of the adjusting screws 24 are caused to move forward and backward or upward and downward in FIG. 4 from the top surface of the frame member 231, so that the degree of inclination of the probe card 102 with respect to the mounting reference surface $S_1$ can be changed.

Each structure of the probe card 102 and the prober 202 except for the above-explained portions are the same as each structure of the probe card 101 and the prober 201 explained in the first embodiment.

According to the second embodiment as explained above, similarly to the first embodiment, even if the parallelism between the mounting reference surface for the probe card and the wafer as the test object is lost, the probes held by the probe card can be brought into uniform contact with the wafer.

Further, according to the second embodiment, preliminary adjustment can be performed before the probe card is mounted on the prober.

Third Embodiment

Figure 5:
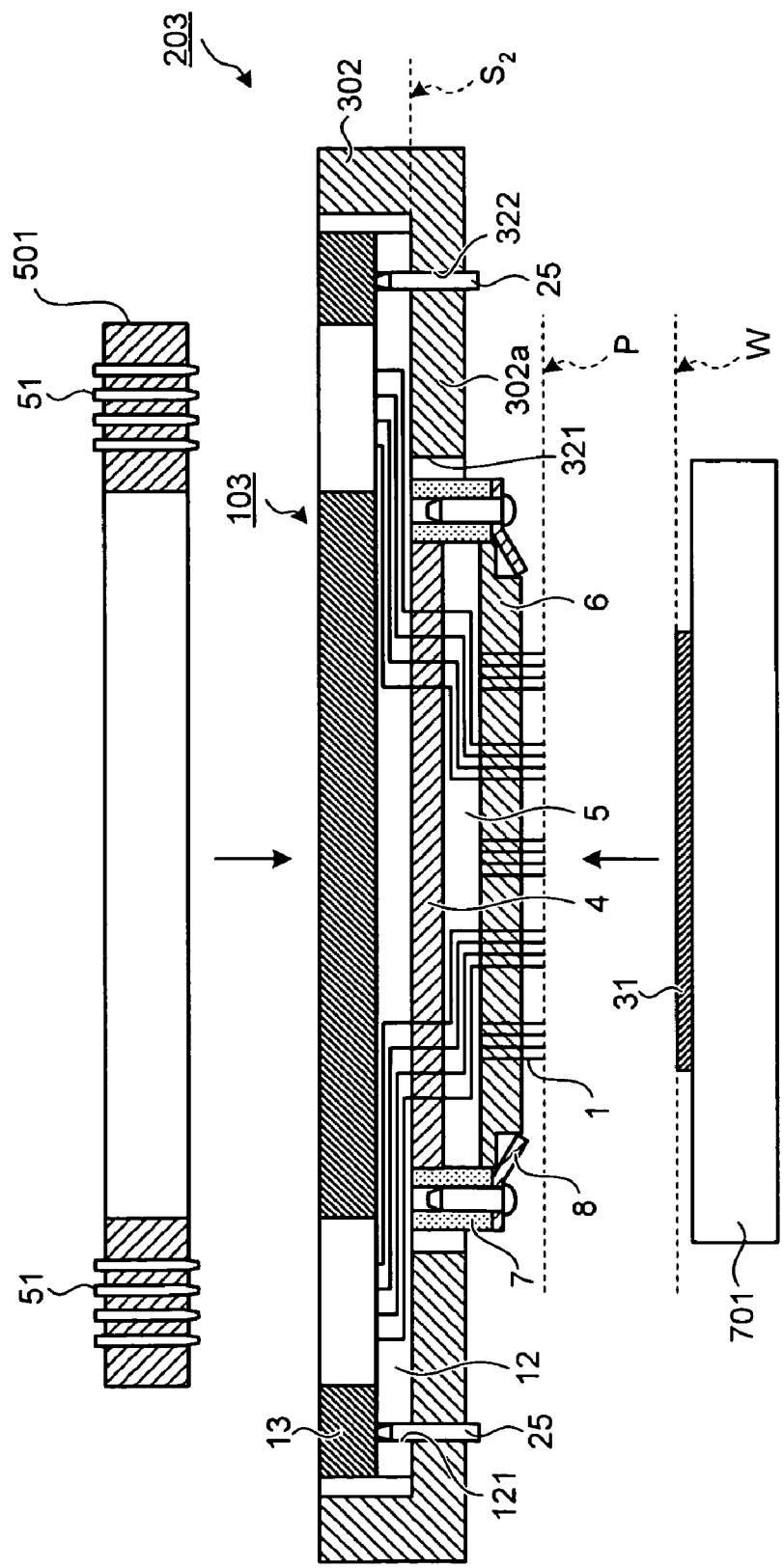
FIG. 5 is a diagram of the structure of a parallelism adjusting mechanism of a probe card according to a third embodiment of the present invention.

FIG. 5 is a diagram of the structure of a parallelism adjusting mechanism of a probe card according to a third embodiment of the present invention. A probe card 103 includes a wiring substrate 12 with wires formed thereon, and a reinforcing member 13 for reinforcing the wiring substrate 12. The probe card 103 also includes the interposer 4, the space transformer 5, the probe head 6, the holding member 7, and the leaf spring 8, each of which has the same structure as that included in the probe card 101 as explained in the first embodiment.

A prober 203 that mounts the probe card 103 thereon includes a probe card holder 302 holding the bottom of the probe card 103 and a hollow plate-shaped terminal seat 501 having a plurality of connection terminals 51 that have an extensible structure due to elastic force of a spring from the upper side of the reinforcing member 13 of the probe card 103. Tips of the connection terminals 51 are arranged at positions opposed to a plurality of electrode pads (not shown) provided on a facet on the wiring substrate 12 and connected to wires inside thereof.

The probe card holder 302 includes a main plate portion 302a formed in a thin disk shape in which a hollow portion 321 for exposing the surface of the probe head 6 is formed in a state of holding the probe card 103 and on which the bottom portion of the wiring substrate 12 can be placed. The top surface of the main plate portion 302a is a mounting reference surface $S_2$ in the prober 203.

When the probe card 103 is to be mounted on the prober 203, the probe card 103 is placed on the main plate portion 302a of the probe card holder 302, and then the terminal seat 501 is pressed against the probe card 103 from the upper side of the probe card 103 to fix the probe card 103 thereto.

Formed near a periphery of the main plate portion 302a of the probe card holder 302 are hole portions 322 penetrating the main plate portion 302a in the thickness direction. Formed also near a periphery of the wiring substrate 12 are hole portions 121 that coaxially communicate with the hole portions 322 respectively when the probe card 103 is placed on the probe card holder 302. These hole portions 322 and 121 are formed at centrally symmetric positions on the same circumference of a circle on the mounting reference surface $S_2$. Provided in each internal side face of these hole portions 322 and 121 is a screw thread (not shown), and adjusting screws 25 for adjusting the parallelism of the probe card 103 are fixed from the bottom side of the probe card holder 302. In the third embodiment also, the number of the adjusting screws 25 is preferably about three to six.

Figure 6:
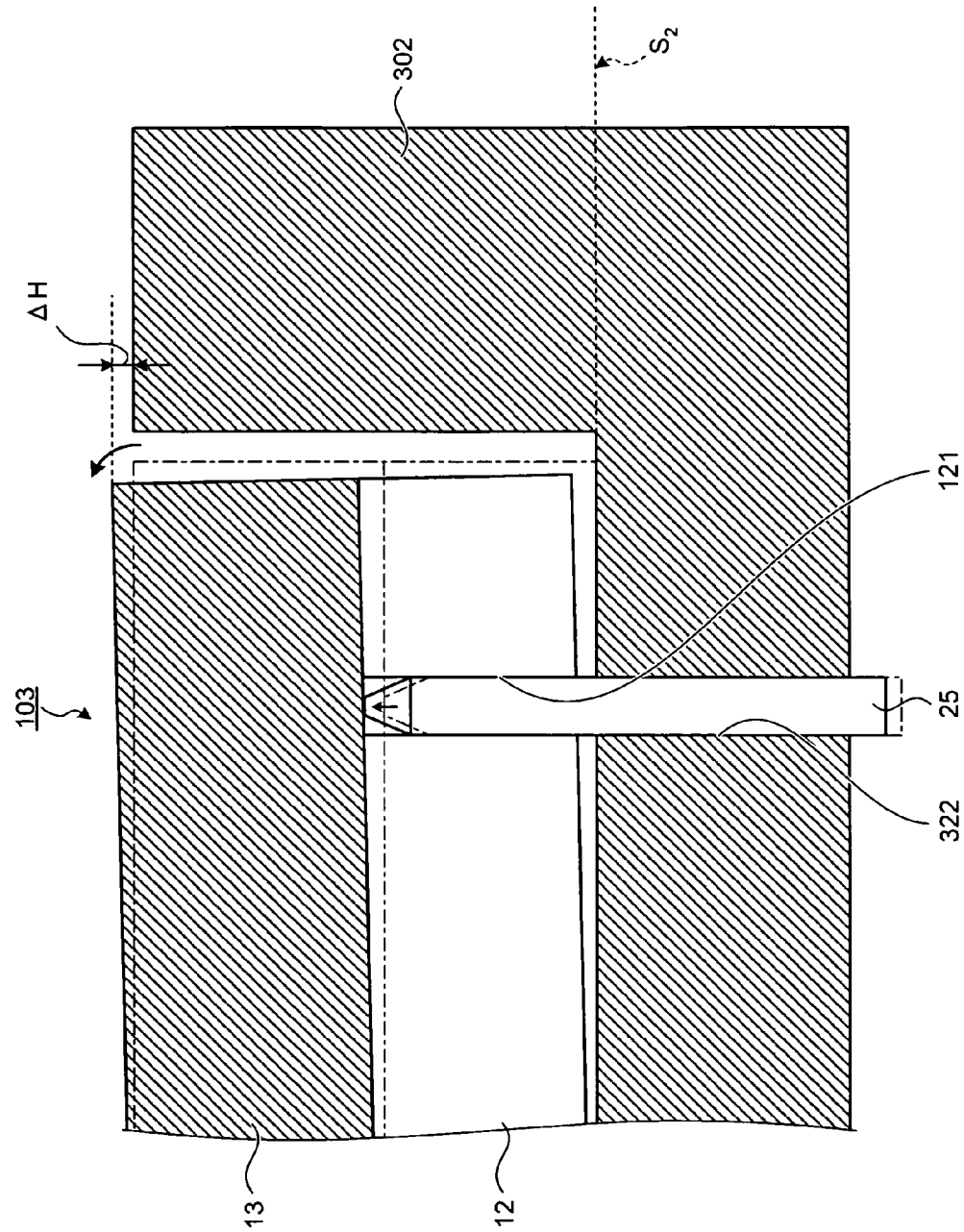
FIG. 6 is a diagram for explaining a function of an adjusting screw used in the third embodiment of the present invention.

Next, the function of the adjusting screw 25 will be explained below with reference to FIG. 6. In the third embodiment, the adjusting screws 25 are turned to move the tip positions of the adjusting screws 25 forward and backward or upward and downward in FIG. 6, so that the probe card 103 is moved with respect to the probe card holder 302, to change the degree of inclination of the probe card 103 with respect to the mounting reference surface $S_2$ as a mounting surface of the probe card holder 302. In this sense, the adjusting screws 25 are formed as at least a part of the inclination changing unit. In the case of FIG. 6, by moving the adjusting screws 25 upward in the figure, the parallelism between the mounting reference surface $S_2$ of the probe card holder 302 and the bottom of the wiring substrate 12 of the probe card 103 is lost. However, this would be no problem because what should be adjusted here is the parallelism between a plane P passing through the tip positions of the probes 1 and a plane W passing through the wafer 31 (see FIG. 5). It is noted that a vertical moving amount ΔH of the probe card 103 moved by the adjusting screws 25 is only about several tens to several hundreds of micrometers (μm).

In the third embodiment, the terminal seat 501 that presses the probe card 103 from the upper side of the probe card 103 can be replaced with a connector seat. In this case, similarly to the first embodiment, a connector opposing the connector seat is simply fixed to the top surface of the wiring substrate 12.

With the parallelism adjusting mechanism of the probe card according to the third embodiment of the present invention as explained above, the parallelism of the probe card that holds the probes electrically connecting the wafer as the test object and the circuitry for generating a signal for a test is adjusted. Therefore, by providing the inclination changing unit that changes the degree of inclination of the probe card with respect to the mounting reference surface of the prober that mounts the probe card thereon, even if the parallelism between the mounting reference surface for the probe card and the wafer as the test object is lost, the probes held by the probe card can be brought into uniform contact with the wafer.

Fourth Embodiment

Figure 7:
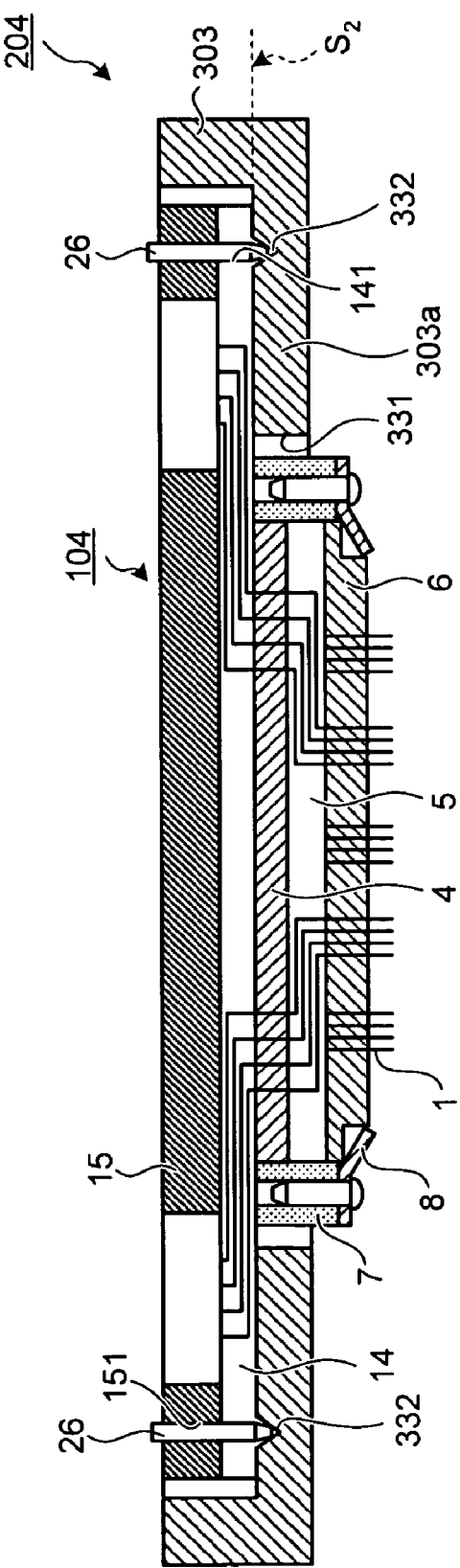
FIG. 7 is a diagram of the structure of a parallelism adjusting mechanism of a probe card according to a fourth embodiment of the present invention.

FIG. 7 is a diagram of the structure of a parallelism adjusting mechanism of a probe card according to a fourth embodiment of the present invention. A probe card 104 includes a wiring substrate 14 with wires formed thereon, and a reinforcing member 15 for reinforcing the wiring substrate 14. Formed near a periphery of the wiring substrate 14 are a plurality of hole portions 141 penetrating the substrate in the thickness direction. Formed also near a periphery of the reinforcing member 15 are hole portions 151 that coaxially communicate with the hole portions 141 of the wiring substrate 14 respectively upon fixture. A screw thread (not shown) is formed in each internal side face of these hole portions 141 and 151, and adjusting screws 26 for adjusting the parallelism of the probe card 104 are fixed from the top surface side of the reinforcing member 15. The structure of the probe card 104 except for the above-explained portion is the same as that of the probe card 101 as explained in the first embodiment.

A prober 204 that mounts the probe card 104 thereon includes a probe card holder 303 that holds the bottom of the probe card 104. The structure of the prober 204 except for the probe card holder 303 is the same as that of the prober 203 in the third embodiment.

The probe card holder 303 includes a main plate portion 303a formed in a thin disk shape in which a hollow portion 331 for exposing the surface of the probe head 6 is formed in a state of holding the probe card 104 and on which the bottom portion of the wiring substrate 14 can be placed. The top surface of the main plate portion 303a is a mounting reference surface $S_2$ in the prober 204. Provided on the top surface of the main plate portion 303a are recesses 332 for centering of the adjusting screws 26 at positions with which the tips of the adjusting screws 26 come into contact, the adjusting screws 26 being screwed into the hole portions 151 and 141 that are formed at centrally symmetric positions on the same circumference of a circle on the mounting reference surface $S_2$ in the reinforcing member 15 and the wiring substrate 14.

In the fourth embodiment, the adjusting screws 26 as at least a part of the inclination changing unit are fixed from the top surface side of the probe card 104 to move the tip positions of the adjusting screws 26 forward and backward or upward and downward in FIG. 7, so that the probe card 104 is moved with respect to the probe card holder 303, to change the degree of inclination of the probe card 104 with respect to the mounting reference surface $S_2$ as a mounting surface of the probe card holder 303. At this time, the tips of the adjusting screws 26 are subjected to centering and are automatically come into contact with and held by the recesses 332 respectively, so that an accurate positioning can be performed. In this sense, the adjusting screws 26 also function as positioning pins for positioning the probe card 104 to the probe card holder 303.

According to the fourth embodiment as explained above, similarly to the first to the third embodiments, even if the parallelism between the mounting reference surface for the probe card and the wafer as the test object is lost, the probes held by the probe card can be brought into uniform contact with the wafer.

Further, according to the fourth embodiment, by providing the recesses on the mounting surface of the probe card at positions with which the tip positions of the adjusting screws come into contact and by performing centering of the adjusting screws, accurate positioning can be achieved.

Fifth Embodiment

Figure 8:
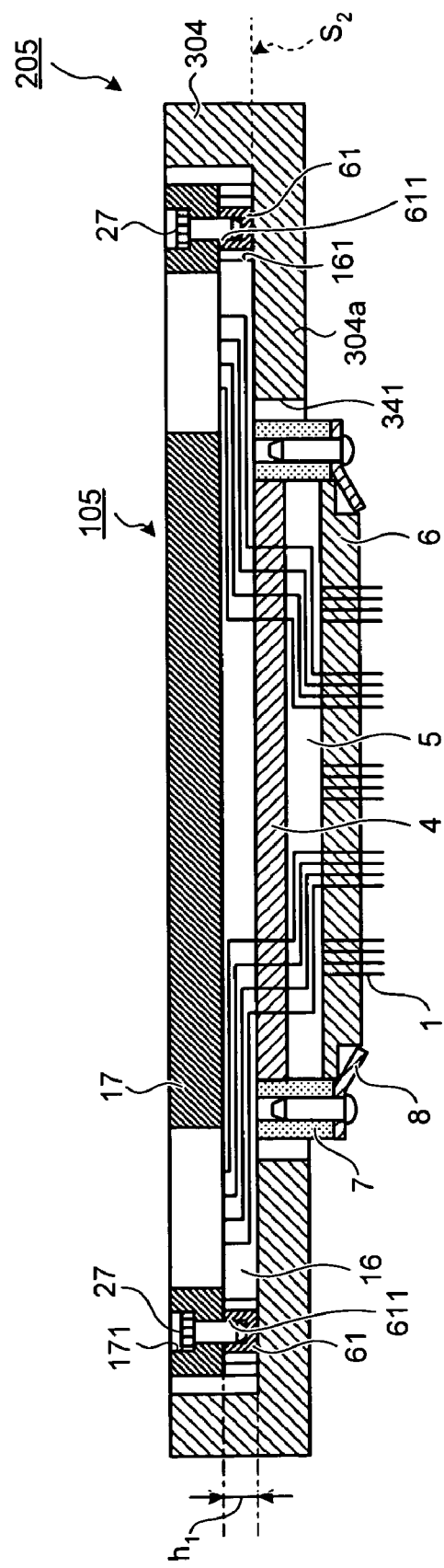
FIG. 8 is a diagram of the structure of a parallelism adjusting mechanism of a probe card according to a fifth embodiment of the present invention.

FIG. 8 is a diagram of the structure of a parallelism adjusting mechanism of a probe card according to a fifth embodiment of the present invention. A probe card 105 includes a wiring substrate 16 with wires formed thereon, and a reinforcing member 17 for reinforcing the wiring substrate 16. Formed near a periphery of the wiring substrate 16 are a plurality of hole portions 161 penetrating the substrate in the thickness direction. Formed also near a periphery of the reinforcing member 17 are hole portions 171 that coaxially communicate with the hole portions 161 of the wiring substrate 16 respectively upon fixture. A screw thread (not shown) into which a fastening screw 27 explained later can be screwed is formed in each internal side face of these hole portions 171. These hole portions 161 and 171 are formed at centrally symmetric positions on the same circumference of a circle on the mounting reference surface $S_2$. The structure of the probe card 105 except for the above-explained portion is the same as that of the probe card 101 as explained in the first embodiment.

A prober 205 that mounts the probe card 105 thereon includes a probe card holder 304 that holds the bottom of the probe card 105. The probe card holder 304 includes a main plate portion 304a formed in a thin disk shape in which a hollow portion 341 for exposing the surface of the probe head 6 is formed in a state of holding the probe card 105 and on which the bottom portion of the wiring substrate 16 can be placed. The top surface of the main plate portion 304a is a mounting reference surface $S_2$ in the prober 205. The structure of the prober 205 except for the probe card holder 304 is the same as that of the prober 203 in the third embodiment.

In the fifth embodiment, the inclination changing unit includes at least three fastening screws 27 arranged at centrally symmetric positions on the same circumference of a circle on the mounting reference surface $S_2$ and fixed from the top surface side of the reinforcing member 17 of the probe card 105 in a direction perpendicular to the mounting reference surface $S_2$, and also includes a plurality of post members 61 that penetrate the hole portions 161 of the wiring substrate 16 in the probe card 105 to be buried therein and that can screw the fastening screws 27, respectively.

Figure 9:
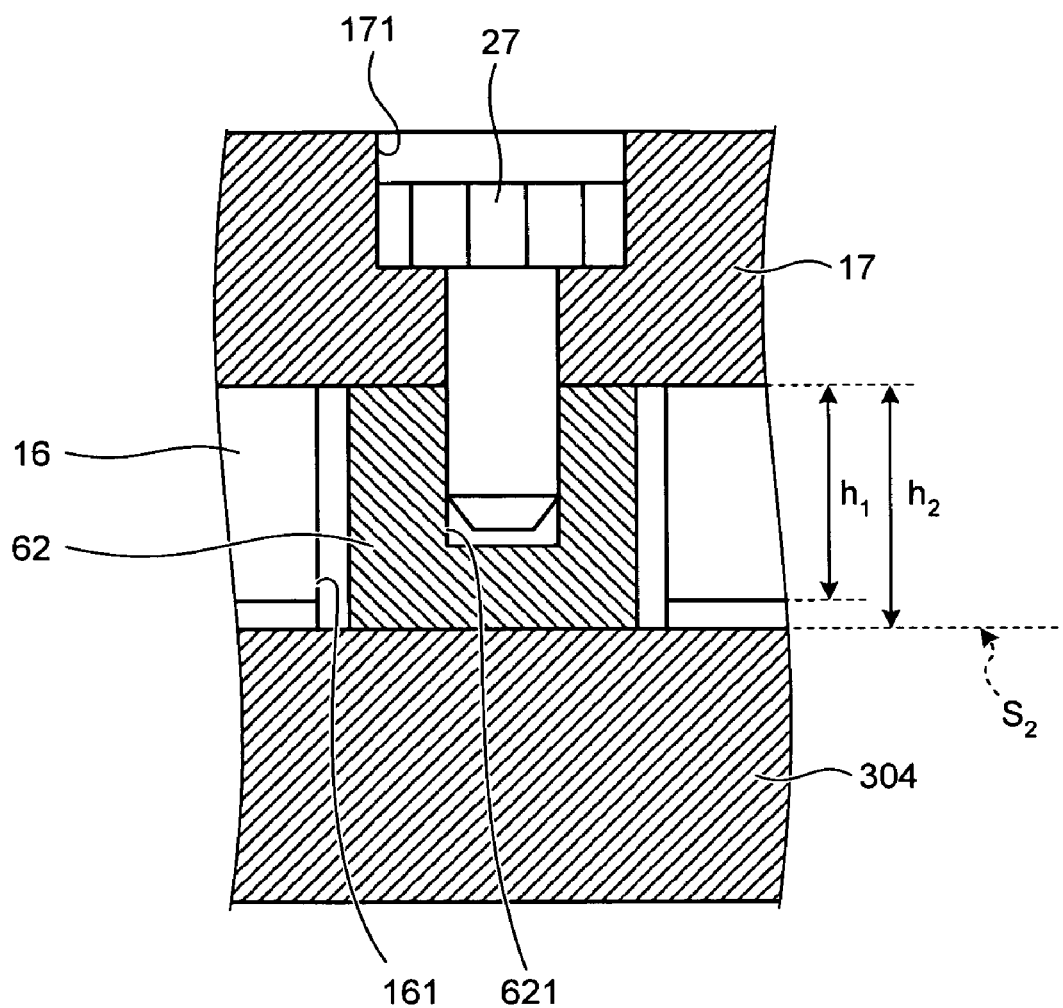
FIG. 9 is a diagram for explaining a function of a post member used in the fifth embodiment of the present invention.

The post member 61 is formed in a cylindrical shape that includes a concave portion 611 into which the fastening screw 27 can be screwed from a bottom on a one side, and its height $h_1$ is larger than the thickness of the wiring substrate 16. In the fifth embodiment, the post members with different heights are buried in the hole portions 161, and the probe card 105 is thereby moved with respect to the probe card holder 304, to change the degree of inclination of the probe card 105 with respect to the probe card holder 304. Specifically, as shown in FIG. 9, for example, by burying a post member 62 that has a height $h_2$ (>$h_1$) different from the post member 61 in any one of the hole portions 161 and that includes a concave portion 621 into which the fastening screw 27 can be screwed, the degree of inclination of the probe card 105 with respect to the probe card holder 304 is changed.

The post members are obtained simply by forming a plurality types of post members of which heights are made different stepwise in units of, for example, about 5 to 10 μm, and optimal combinations are found out from these post members to be buried in the hole portions 161 respective, to adjust the parallelism of the probe card 105.

According to the fifth embodiment of the present invention as explained above, by using the types of post members with predetermined heights as required to change the degree of inclination of the probe card with respect to the probe card holder, even if the parallelism between the mounting reference surface for the probe card and the wafer as the test object is lost, the probes held by the probe card can be brought into uniform contact with the wafer.

Other Embodiments

The first to the fifth embodiments are described above as the best modes for carrying out the present invention, however, the present invention is not to be restricted to them. For example, recesses similar to the recesses 332 formed in the probe card holder 303 in the fourth embodiment may be formed at positions with which the tips of adjusting screws come into contact in other embodiments.

The invention in its broader aspects is not limited to the specific details and representative embodiments shown and described herein. Accordingly, various modifications may be made without departing from the spirit or scope of the general inventive concept as defined by the appended claims and their equivalents.

INDUSTRIAL APPLICABILITY

As explained above, the present invention is suitable for adjusting a parallelism of a probe card that electrically connects a wafer as a test object and a circuitry for generating a signal for a test.

The invention claimed is:

1. A parallelism adjusting mechanism of a probe card, comprising:
    a probe card for holding a plurality of probes electrically connecting a wafer as a test object and a circuitry for generating a test signal, the probe card comprising a wiring substrate and a reinforcing member that is mounted on one side of the wiring substrate;
    a prober for mounting thereon the probe card, the prober comprising a support member, a frame member supported by the support member and arranged at one side of the probe card opposite to a side at which the probe card holding the probes, and a docking member having a surface area smaller than that of the reinforcing member and interposed between the frame member and the probe card; and
    an inclination changing unit that moves the docking member or the probe card relative to the frame member and changes a degree of inclination of the probe card with respect to a lower surface of the frame member as a mounting reference surface for the probe card to be mounted on the prober to adjust a parallelism of the probe card with respect to the wafer.

2. The parallelism adjusting mechanism of the probe card according to claim 1, wherein the docking member is fastened to the frame member, and
    the inclination changing unit moves the docking member with respect to the frame member.

3. The parallelism adjusting mechanism of the probe card according to claim 2, wherein
    the inclination changing unit includes at least three adjusting screws which are arranged on a circumference of a circle on the mounting reference surface, and are fixed to the frame member so as to be movable in a direction perpendicular to the mounting reference surface, and of which tips can come into contact with a surface of the docking member.

4. The parallelism adjusting mechanism of the probe card according to claim 3, wherein recesses for centering are formed in the docking member at positions with which the tips of the adjusting screws come into contact.

5. The parallelism adjusting mechanism of the probe card according to claim 1, wherein
    the docking member is fastened to the probe card, and the inclination changing unit moves the probe card with respect to the docking member.

6. The parallelism adjusting mechanism of the probe card according to claim 5, wherein the inclination changing unit includes at least three adjusting screws which are arranged on a circumference of a circle on the mounting reference surface, and are fixed to the docking member so as to be movable in a direction perpendicular to the mounting reference surface, and of which tips can come into contact with a surface of the probe card.

7. The parallelism adjusting mechanism of the probe card according to claim 6, wherein recesses for centering are formed at positions of the probe card with which the tips of the adjusting screws come into contact.

8. A parallelism adjusting mechanism of a probe card, comprising:
    a probe card for holding a plurality of probes electrically connecting a wafer as a test object and a circuitry for generating a test signal;
    a prober for mounting thereon the probe card; and
        an inclination changing in unit that changes a degree of inclination of the probe card with respect to a mounting reference surface for the probe card to be mounted on the prober to adjust a parallelism of the probe card with respect to the wafer wherein
    the prober includes a probe card holder on which a part of a surface of the probe card on a side of the probes that protrude is mounted, the mounting surface being the mounting reference surface, and
    the inclination changing unit moves the probe card with respect to the probe card holder.

9. The parallelism adjusting mechanism of the probe card according to claim 8, wherein the probe card includes
    a wiring substrate that includes wires electrically connecting the probes and the circuitry; and
    a reinforcing member that is mounted on the wiring substrate to reinforce the wiring substrate, and
    the inclination changing unit includes at least three adjusting screws which are arranged on a circumference of a circle on the mounting reference surface, and are fixed from a bottom of the probe card holder so as to be movable in a direction perpendicular to the mounting reference surface, and of which tips can come into contact with a bottom of the reinforcing member.

10. The parallelism adjusting mechanism of the probe card according to claim 8, wherein
    the inclination changing unit includes at least three adjusting screws which are arranged on the circumference of the circle on the mounting reference surface, are fixed from a top surface of the probe card so as to be movable in the direction perpendicular to the mounting reference surface, and can come into contact with the mounting surface of the probe card holder, and
    recesses for centering are formed at positions on the mounting surface with which tips of the adjusting screws come into contact.

11. The parallelism adjusting mechanism of the probe card according to claim 8, wherein the probe card includes
- a wiring substrate that includes wires electrically connecting the probes and the circuitry; and a reinforcing member that is mounted on the wiring substrate to reinforce the wiring substrate, and
- the inclination changing unit includes
    - at least three fastening screws which are arranged on the circumference of the circle on the mounting reference surface, and are fixed from a top surface of the reinforcing member so as to be movable in the direction perpendicular to the mounting reference surface; and
    - a plurality of post members that penetrate the wiring substrate in its thickness direction and are buried therein, have a height larger than the thickness of the wiring substrate, and can screw the fastening screws thereinto, respectively, the plurality of post members including post members having different heights.

* * * * *